(12) United States Patent
Collard

(10) Patent No.: US 6,897,133 B2
(45) Date of Patent: May 24, 2005

(54) METHOD FOR PRODUCING A SCHOTTKY DIODE IN SILICON CARBIDE

(75) Inventor: Emmanuel Collard, Tours (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/415,425

(22) PCT Filed: Oct. 30, 2001

(86) PCT No.: PCT/FR01/03379

§ 371 (c)(1),
(2), (4) Date: Apr. 29, 2003

(87) PCT Pub. No.: WO02/37546

PCT Pub. Date: May 10, 2002

(65) Prior Publication Data

US 2004/0110330 A1 Jun. 10, 2004

(30) Foreign Application Priority Data

Oct. 31, 2000 (FR) .............................. 00 14012

(51) Int. Cl.⁷ .......................... H01L 21/28; H01L 21/44
(52) U.S. Cl. .................... 438/570; 438/92; 438/169; 438/931
(58) Field of Search ........................ 438/92, 169, 570, 438/571, 573, 576, 578, 580, 581, 931; 257/77

(56) References Cited

U.S. PATENT DOCUMENTS

| | | | |
|---|---|---|---|
| 3,575,731 A | 4/1971 | Hoshi et al. | |
| 3,891,479 A | * 6/1975 | Zwernemann | 438/573 |
| 4,636,269 A | 1/1987 | Boland | |
| 5,696,025 A | * 12/1997 | Violette et al. | 438/570 |
| 5,917,204 A | 6/1999 | Bhatnagar et al. | |
| 5,917,228 A | 6/1999 | Matsuda et al. | |
| 6,091,108 A | 7/2000 | Harris et al. | |
| 6,693,308 B2 | * 2/2004 | Sankin et al. | 257/77 |

FOREIGN PATENT DOCUMENTS

EP 0380340 A 1/1990

OTHER PUBLICATIONS

International Search Report from corresponding PCT application No. PCT/FR01/03379, filed Oct. 30, 2001.
Patent Abstracts of Japan vol. 002, No. 051 (E–026), Apr. 12, 1978 & JP 53 014579.

* cited by examiner

Primary Examiner—Evan Pert
Assistant Examiner—Asok Kumar Sarkar
(74) Attorney, Agent, or Firm—Lisa K. Jorgenson; James H. Morris; Wolf, Greenfield & Sacks, P.C.

(57) ABSTRACT

The invention concerns a method for making a vertical Schottky diode on a highly doped N-type silicon carbide substrate (1), comprising steps which consist in forming an N-type lightly doped epitaxial layer (2); etching out a peripheral trench at the active zone of the diode; forming a type P doped epitaxial layer; carrying out a planarization process so that a ring (6) of the P type epitaxial layer remains in the trench; forming an insulating layer (3) on the outer periphery of the component, said insulating layer partly covering said ring; and depositing a metal (4) capable of forming a Schottky barrier with the N type epitaxial layer.

3 Claims, 2 Drawing Sheets

METHOD FOR PRODUCING A SCHOTTKY DIODE IN SILICON CARBIDE

BACKGROUND OF THE INVENTION

The present invention relates to the forming of a Schottky diode in silicon carbide.

1. Field of the Invention

In the field of semiconductor components, the material which is currently mainly used is silicon. To withstand very high voltages, silicon carbide is a priori preferable since silicon carbide has a breakdown voltage per unit thickness approximately 10 times greater than silicon.

However, in the present state of technologies, the processes currently used to form silicon-based components cannot be transposed to form silicon carbide (SiC)-based components. In particular, it is currently not possible in practice to perform implantations and diffusions of P-type dopants in N-type doped silicon carbide, noting that the P-type dopant currently used for silicon carbide is aluminum and that the N-type dopant is nitrogen. Indeed, an anneal for diffusion of an implantation of a P-type dopant would require temperatures on the order of 1700° C., which raises acute technological problems.

2. Discussion of the Related Art

The elementary structure of a Schottky diode is illustrated in FIG. 1. This diode is formed from a heavily-doped N-type substrate 1 on which is formed an N-type epitaxial layer 2 properly doped to have the desired Schottky threshold. On this epitaxial layer N is deposited silicon oxide 3 defining a window in which the Schottky contact is desired to be established by means of an adequate metallization 4. The rear surface of the component is coated with a metallization 5.

Such a structure has a very low breakdown voltage. Indeed, the equipotential surfaces tend to curve up to rise to the surface at the periphery of the contact area, which results, especially in the equipotential surface curving areas, in very high field values, which limit the possible reverse breakdown voltage. To avoid this disadvantage, the structure shown in FIG. 2 in which a P-type peripheral ring 6 is formed by implantation-diffusion at the periphery of the active area of the Schottky diode is conventionally used for silicon-based components. As a result, the equipotential surfaces must pass in volume under the P regions and thus have a less marked curvature. The diode breakdown voltage is considerably improved. As an example with silicon having a $10^{16}$ at./cm$^3$ doping level, the breakdown voltage will be on the order of 10 V with no guard ring and on the order of 50 V with a guard ring.

However, as previously indicated, the forming of such a P-type guard ring is not simply implementable by implantation/diffusion in a structure formed on a silicon carbide substrate. In this case, the simple structure illustrated in FIG. 1 is not desirable either, for the same reasons as in the case of a silicon substrate.

SUMMARY OF THE INVENTION

Thus, the present invention aims at providing a method of formation of a Schottky diode having a relatively high breakdown voltage that can be simply implemented when the semiconductor is silicon carbide.

To achieve these and other objects, the present invention provides a method for manufacturing a vertical Schottky diode on a heavily-doped N-type silicon carbide substrate, including the steps of forming a lightly-doped N-type epitaxial layer; digging a trench peripheral to the active diode area; forming a P-type doped epitaxial layer; planarizing so that a ring of the P-type epitaxial layer remains in the trench; forming on the external periphery of the component an insulating layer partially covering said ring; and depositing a metal capable of forming a Schottky barrier with the N-type epitaxial layer.

According to an embodiment of the present invention, the method further includes the steps of forming, at the same time as the peripheral trench, central grooves which are filled with portions of the P-type epitaxial layer, to form a diode of Schottky-bipolar type.

According to an embodiment of the present invention, the N-type epitaxial layer has a thickness on the order of a few $\mu$m and a doping level on the order of $10^{16}$ atoms/cm$^3$, and the P-type epitaxial layer has a doping level on the order of $10^{16}$ atoms/cm$^3$ and is formed in a trench having a depth on the order of one $\mu$m.

The foregoing objects, features and advantages of the present invention, will be discussed in detail in the following non-limiting description of specific embodiments in connection with the accompanying drawings, in which:

DETAILED DESCRIPTION

As usual in the field of semiconductor representation, in the various drawings, the various layers are not drawn to scale, either in their horizontal dimensions, or in their vertical dimensions.

Figure 3A:
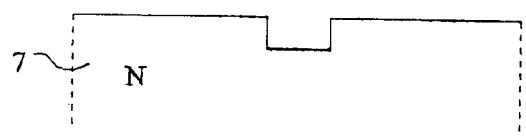
FIGS. 3A to 3C illustrate successive steps of formation of a doped area in a silicon carbide substrate.
Figure 3B:
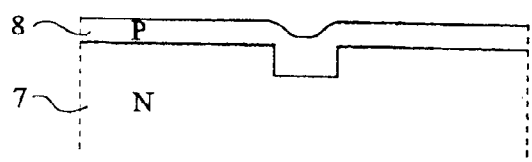
Figure 3C:
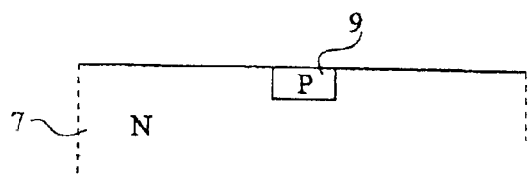

As illustrated in FIGS. 3A to 3C, the present invention provides a succession of steps enabling formation of a doped area in a silicon carbide substrate without requiring use of very high temperatures.

At the step of FIG. 3A, a trench has been formed in a silicon carbide substrate 7. This trench has dimensions corresponding to those of the doped area which is desired to be formed and is formed by any adapted photolithographic etch method. Substrate 7 is a massive substrate or an epitaxial layer formed on a support.

At the step of FIG. 3B, a doped epitaxial layer 8 of the desired conductivity type, for example, of a type opposite to that of the substrate, has been formed. A P-type layer may for example be formed on an N-type substrate.

At the step of FIG. 3C, a planarization has been performed so that there remains a portion 9 of the epitaxial layer in the trench. The desired result has then been obtained.

Figure 4:
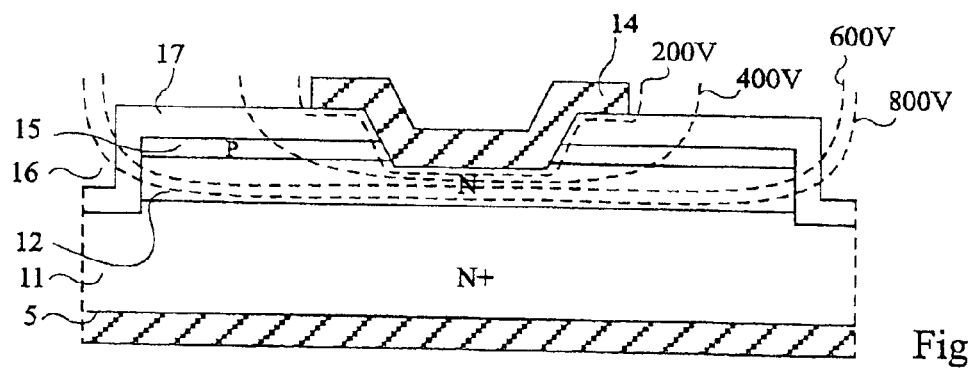
FIG. 4 is a simplified cross-section view of a Schottky diode on a silicon carbide substrate.

In a prior attempt to form a Schottky diode with a high breakdown voltage based on a silicon carbide wafer, the applicant has provided in unpublished French patent application N°99/16490 filed Dec. 24, 1999 (B4379) the structure illustrated in FIG. 4. This application is hereby incorporated by reference.

The structure of FIG. 4 is formed from a heavily-doped N-type silicon carbide wafer 11. A more lightly doped N-type thin epitaxial layer 12 is formed on wafer 11. For a desired breakdown voltage on the order of from 600 to 1000 V, this epitaxial layer has a thickness on the order of from 3 to 6 μm. The Schottky contact is formed between this layer 12 and a metallization 14, for example a platinum, titanium, or nickel silicide, or other. The rear surface of wafer 11 is coated with a metallization 5 corresponding to the diode cathode.

This structure is formed by performing the steps of:

forming a thin P-type doped silicon carbide epitaxial layer 15, the dopant being for example aluminum, forming a peripheral trench 16 having substantially the depth of the sum of the thicknesses of epitaxial layers 12 and 15, depositing a layer of a protection insulator 17, for example silicon oxide, and forming a central opening in which is formed Schottky metal layer 14, which is thus in contact with N layer 12 and which biases P layer 15.

The distance between the periphery of the Schottky contact and the trench is on the order of from 30 to 60 μm, for example, 40 μm.

The doping of P-type layer 15 is chosen so that, when a voltage close to the maximum reverse voltage that the diode must withstand is applied thereto, the equipotential surfaces, instead of all rising back up to the surface, extend at least partially to trench 16. For a diode able to withstand from 800 to 1000 V, four equipotential surfaces corresponding to four values also distributed of the potential, for example, values close to 200, 400, 600 and 800 V, have been shown. It should be noted that the equipotential surface substantially corresponding to 600 V reaches the trench.

The structure of FIG. 4 requires accurate adjustment of the dimensions and doping parameters, as well as a good quality of the insulator covering the trench walls.

As a consequence, the present inventors have searched a way of forming a Schottky diode with a high breakdown voltage which, like the structure of FIG. 4, can be formed on silicon carbide, but is easier to form.

Figure 1:
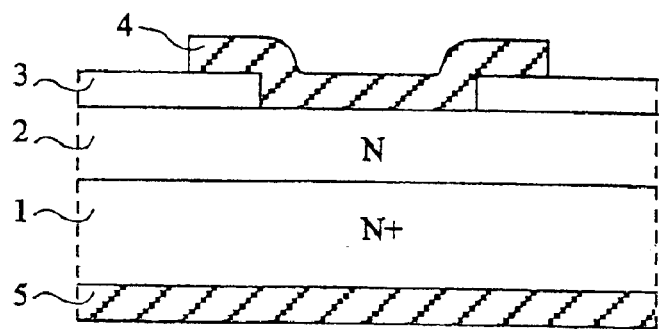
FIG. 1 is a simplified cross-section view of an elementary Schottky diode.
Figure 2:
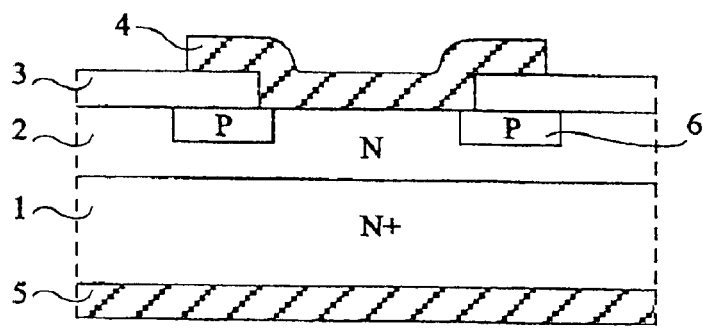
FIG. 2 is a simplified cross-section view of a conventional Schottky diode on a silicon substrate.

To achieve this object, the present inventors have examined again the structure conventionally formed on a silicon substrate shown in FIG. 2 and, instead of trying to modify this structure, use, to obtain this structure, the method described in relation with FIGS. 3A to 3C.

Thus, to form the structure of FIG. 2 on a silicon carbide substrate, the present inventors start from a heavily-doped $N^+$-type silicon carbide substrate 1 on which a more lightly doped N-type silicon carbide layer 2 is formed. The N dopant is for example nitrogen.

According to the present invention, in substrate 2, a peripheral trench surrounding the active diode area is formed, after which a P-type doped silicon carbide layer is deposited by epitaxy. The P dopant is for example aluminum. After this deposition, a planarization is performed so that there only remains ring-shaped P-type layer 6 present in the previously formed trench. This planarization is for example performed by chem-mech polishing. After this, an insulating layer 4 is deposited and etched, and metallization 4 is formed to obtain the structure shown in FIG. 2.

Thus, conversely to the state of the art on silicon in which P-type ring 6 results from an implantation-diffusion, according to the present invention, P-type ring 6 results from an epitaxy. The fact that this P-type region results from an epitaxy instead of from an implantation-diffusion results in that this P-type region has a homogeneous doping level while, when a structure results from an implantation-diffusion, it includes doping level unevennesses. For example, if the implantation is a surface implantation, the surface doping is heavier than the doping at the junction.

The present inventors have performed simulations on the obtained structure by using simulations methods known per se, and by using the simulation program known as ISE-DESSIS, sold by ISE Company. The simulations have shown that, for a structure of the type of that in FIG. 2, with an N-type epitaxial layer having a 12-μm thickness and a $8.10^{15}$ at./cm$^3$ doping level, in the case of a structure with a P-type ring obtained by implantation-diffusion of a 0.7-μm depth and of a $2.10^{17}$ at./cm$^3$ doping level, a 1205-volt reverse breakdown voltage is obtained;

in the case of a trench having a 1.5-μm depth filled with a P-type epitaxial layer having the same $2.10^{17}$ at./cm$^3$ doping level, a 1223-volt reverse breakdown voltage is obtained;

in the case of a trench having a 1.5-μm depth filled with a P-type epitaxial layer having a $5.10^{16}$ at./cm$^3$ doping level, a 1415-volt reverse breakdown voltage is obtained.

A structure may for example be used in which the N-type epitaxial layer has a thickness on the order of a few μm and a doping level on the order of $10^{16}$ atoms/cm$^3$, and the P-type epitaxial layer has a doping level on the order of $10^{16}$ atoms/cm$^3$ and is formed in a trench having a depth on the order of one μm.

Further, simulations show that, when a structure according to the present invention is urged to breakdown, the breakdown occurs substantially in the middle of the P-type ring. Thus, this is a volume breakdown and not a surface breakdown, and it is well known that the maximum possible theoretical breakdown voltage is then reached.

The structure according to the present invention has also been compared to the structure illustrated in FIG. 4 and it has been acknowledged that, there also, the breakdown voltage is better than in similar conditions, that is, for a same doping level of the N-type epitaxial layer in the case of the present invention with respect to the case of FIG. 4.

In addition to this advantage of manufacturing ease and of better breakdown voltage of the structure of the present invention as compared to the structure of prior art, it should be noted that another advantage of the present invention is that it is adapted to the forming of diodes of a specific type, known as Schottky/bipolar diodes. In such diodes, the metallization is in some places in contact with the N-type epitaxial layer and forms therewith a Schottky contact, and in some places in contact with P-type regions and forms therewith an ohmic contact. The distance between N and P regions is calculated in a way known in the art to optimize the breakdown voltage and the diode rapidity.

Figure 5:
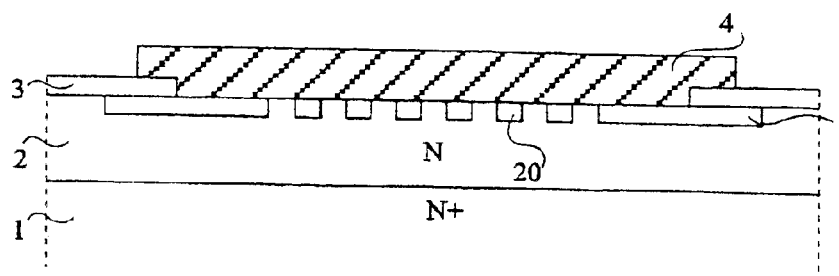
FIG. 5 shows an example of a Schottky-bipolar diode according to the present invention.

Such a diode is shown in FIG. 5. It includes the same substrate and the same peripheral region 6 as the diode of FIG. 2. However, it further includes under contact 4, regularly spaced apart P-type doped regions 20. These regions have for example concentric ring shapes or are parallel strips. According to the present invention, regions 20 result from the forming of trenches at the same time as the forming of the peripheral trench. Thus, upon deposition of a P-type epitaxial layer, the P-type epitaxial layer fills the central trenches at the same time as the peripheral trench. After chem-mech polishing or another planarization step, the structure of FIG. 5 in which the peripheral trench is filled with a portion of epitaxial layer 6 and the central trenches are filled with portions 20 of the same epitaxial layer is simply obtained.

Of course, the present invention is likely to have various alterations, modifications, and improvements which will readily occur to those skilled in the art, in particular as concerns the dimensions of the various layers, vertically as well as horizontally.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. A method for manufacturing a component comprising a vertical Schottky diode having an active area on a heavily-doped N-type silicon carbide substrate, including the steps of:

forming a lightly-doped N-type epitaxial layer;

digging a trench peripheral to the active diode area;

forming a P-type doped epitaxial layer;

planarizing so that a ring of the P-type epitaxial layer remains in the trench;

forming on the external periphery of the component an insulating layer partially covering said ring; and depositing a metal likely to form a Schottky barrier with the N-type epitaxial layer.

2. The method of claim 1, characterized in that it further includes the steps of forming at the same time as the peripheral trench central grooves which are filled with portions of the P-type epitaxial layer, to form a diode of Schottky-bipolar type.

3. The method of claim 1, characterized in that the N-type epitaxial layer has a thickness on the order of a few $\mu$m and a doping level on the order of $10^{16}$ atoms/cm$^3$, and the P-type epitaxial layer has a doping level on the order of $10^{16}$ atoms/cm$^3$ and is formed in a trench having a depth on the order of one $\mu$m.

* * * * *

UNITED STATES PATENT AND TRADEMARK OFFICE
CERTIFICATE OF CORRECTION

PATENT NO. : 6,897,133 B2
DATED : May 24, 2005
INVENTOR(S) : Emmanuel Collard

It is certified that error appears in the above-identified patent and that said Letters Patent is hereby corrected as shown below:

Column 6,
Line 9, should read -- 2. The method of claim 1, wherein it further --
Line 14, should read -- 3. The method of claim 1, wherein the N-type --

Signed and Sealed this

Twelfth Day of July, 2005

JON W. DUDAS
*Director of the United States Patent and Trademark Office*